United States Patent
Wei

(10) Patent No.: US 8,227,174 B2
(45) Date of Patent: Jul. 24, 2012

(54) PATTERNING METHODS AND MASKS

(75) Inventor: Yayi Wei, Altamont, NY (US)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 12/715,215

(22) Filed: Mar. 1, 2010

(65) Prior Publication Data

US 2010/0151365 A1    Jun. 17, 2010

Related U.S. Application Data

(62) Division of application No. 11/331,454, filed on Jan. 13, 2006, now abandoned.

(51) Int. Cl.
*G03F 7/26* (2006.01)
(52) U.S. Cl. .............................. 430/313; 430/5; 430/311
(58) Field of Classification Search ........................ None
See application file for complete search history.

(56) References Cited

U.S. PATENT DOCUMENTS

| | | |
|---|---|---|
| 5,208,124 A | 5/1993 | Sporon-Fiedler et al. |
| 5,667,919 A | 9/1997 | Tu et al. |
| 5,723,233 A | 3/1998 | Garza et al. |
| 5,976,741 A | 11/1999 | Ziger et al. |
| 5,994,002 A | 11/1999 | Matsuoka |
| 6,682,861 B2 | 1/2004 | Chan |
| 6,842,222 B2 | 1/2005 | Kunkel et al. |
| 2004/0009416 A1 | 1/2004 | Peterson et al. |
| 2005/0084782 A1 | 4/2005 | Sentoku |
| 2005/0275043 A1 | 12/2005 | Huang et al. |

OTHER PUBLICATIONS

"E95 Overview (Lecture 3): E95 and the K1 Factor," Gigaphoton Inc./Technology/E95/E95 and the K1 Factor, http://www.gigaphoton.com/e/topics2c.html, downloaded Jan. 11, 2006, 4 pages, Gigaphoton, Inc., Japan.

*Primary Examiner* — Daborah Chacko Davis
(74) *Attorney, Agent, or Firm* — Slater & Matsil, L.L.P.

(57) ABSTRACT

Masks for patterning material layers of semiconductor devices, methods of patterning and methods of manufacturing semiconductor devices, and lithography systems are disclosed. A lithography mask includes a pattern of alternating lines and spaces, wherein the lines and spaces comprise different widths. When the lithography mask is used to pattern a material layer of a semiconductor device, the pattern of the material layer comprises alternating lines and spaces having substantially the same width.

20 Claims, 5 Drawing Sheets

PATTERNING METHODS AND MASKS

This application is a divisional of patent application Ser. No. 11/331,454, entitled "Patterning Methods and Masks" which was filed on Jan. 13, 2006 now abandoned and is incorporated herein by reference.

TECHNICAL FIELD

The present invention relates generally to the fabrication of semiconductor devices, and more particularly to the patterning of material layers of semiconductor devices.

BACKGROUND

Generally, semiconductor devices are used in a variety of electronic applications, such as computers, cellular phones, personal computing devices, and many other applications. Home, industrial, and automotive devices that in the past comprised only mechanical components now have electronic parts that require semiconductor devices, for example.

Semiconductor devices are manufactured by depositing many different types of material layers over a semiconductor workpiece or wafer, and patterning the various material layers using lithography. The material layers typically comprise thin films of conductive, semiconductive, and insulating materials that are patterned and etched to form integrated circuits (IC's). There may be a plurality of transistors, memory devices, switches, conductive lines, diodes, capacitors, logic circuits, and other electronic components formed on a single die or chip, for example.

Optical photolithography involves projecting or transmitting light through a pattern made of optically opaque areas and optically clear areas on a mask or reticle. For many years in the semiconductor industry, optical lithography techniques such as contact printing, proximity printing, and projection printing have been used to pattern material layers of integrated circuits. Projection printing is commonly used in the semiconductor industry using wavelengths of 248 nm or 193 nm, as examples. At such wavelengths, lens projection systems and transmission lithography masks are used for patterning, wherein light is passed through the lithography mask to impinge upon a semiconductor wafer or workpiece.

There is a trend in the semiconductor industry towards scaling down the size of integrated circuits, to meet demands of increased performance and smaller device size. As the minimum feature sizes of IC's are decreased, the semiconductor industry is exploring the use of alternatives to traditional optical lithography techniques, in order to meet the demand for decreased feature sizes in the industry. For example, short wavelength lithography techniques, Scattering with Angular Limitation in Projection Electron-beam Lithography (SCALPEL), other non-optical lithographic techniques, and immersion lithography are under development as replacements for traditional optical lithography techniques.

In immersion lithography, a gap between the last lens element in the optics system and a semiconductor wafer is filled with a liquid, such as water, to enhance system performance. The presence of the liquid enables the index of refraction in the imaging plane, and therefore the numerical aperture of the projection system, to be greater than unity. Thus, immersion lithography has the potential to extend exposure tool minimum feature sizes down to about 45 nm or less, for example.

As features of semiconductor devices become smaller, it becomes more difficult to pattern material layers because of diffraction and other effects that occur during the lithography process. In particular, lithography techniques used to pattern the various material layers become challenging as device features shrink.

Thus, what are needed in the art are improved lithography techniques and lithography masks that are capable of patterning smaller features of semiconductor devices.

SUMMARY OF THE INVENTION

These and other problems are generally solved or circumvented, and technical advantages are generally achieved, by preferred embodiments of the present invention, which provide novel methods of patterning semiconductor devices and novel lithography masks.

In accordance with a preferred embodiment of the present invention, a method of manufacturing a semiconductor device includes providing a lithography mask, the lithography mask including a first pattern for a plurality of alternating lines and spaces. The lines of the first pattern have a first width, the spaces of the first pattern have a second width, the second width being different than the first width. A workpiece is provided, the workpiece having a layer of photosensitive material disposed thereon. The layer of photosensitive material is patterned using the lithography mask, forming a second pattern for a plurality of alternating lines and spaces in the layer of photosensitive material, the lines of the second pattern and the spaces of the second pattern having a third width, the third width being different than the first width and the second width.

The foregoing has outlined rather broadly the features and technical advantages of embodiments of the present invention in order that the detailed description of the invention that follows may be better understood. Additional features and advantages of embodiments of the invention will be described hereinafter, which form the subject of the claims of the invention. It should be appreciated by those skilled in the art that the conception and specific embodiments disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawings, in which.

Corresponding numerals and symbols in the different figures generally refer to corresponding parts unless otherwise indicated. The figures are drawn to clearly illustrate the relevant aspects of the preferred embodiments and are not necessarily drawn to scale.

DETAILED DESCRIPTION OF ILLUSTRATIVE EMBODIMENTS

Figure 1:
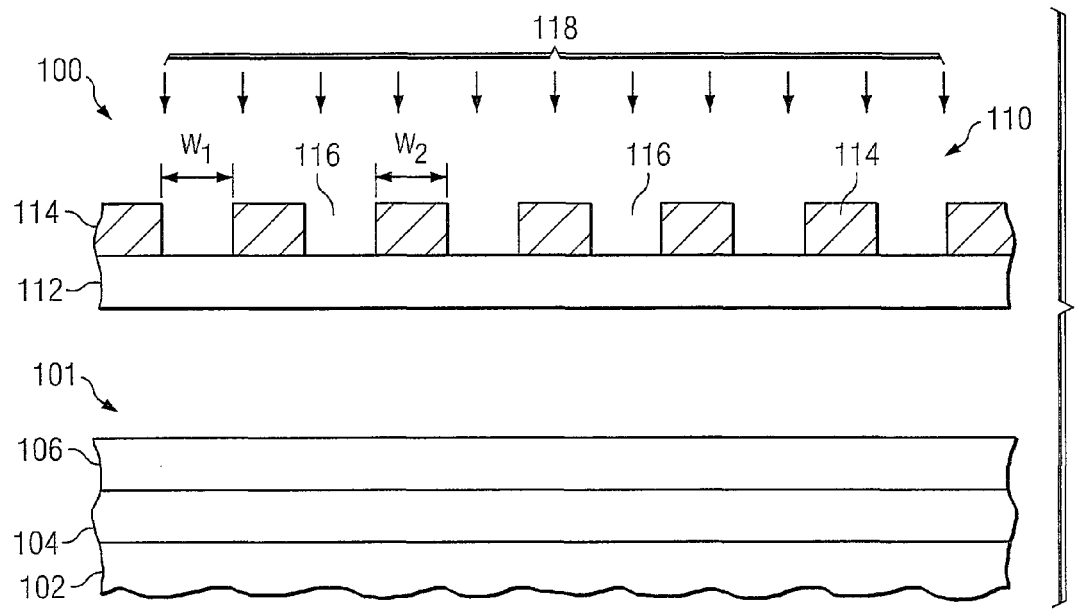
FIGS. 1 through 4 show cross-sectional views of a prior art method of patterning a material layer of a semiconductor device.

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The present invention will be described with respect to preferred embodiments in a specific context, namely the patterning of material layers of semiconductor devices. Embodiments of the invention may also be applied, however, to other applications where material layers are patterned, for example.

FIGS. 1 through 4 show cross-sectional views of a prior art method of patterning a material layer 104 of a semiconductor device 101 using a projection lithography system 100. A lithography mask 110 comprising a transparent substrate 112 and a patterned opaque material 114 is placed between a light source (not shown) that emits light 118 towards a semiconductor device 101. The opaque material 114 typically comprises chromium or other opaque material. The semiconductor device 101 includes a workpiece 102 or substrate having a material layer 104 to be patterned disposed thereon. A layer of photosensitive material 106 comprising photoresist, for example, is disposed over the material layer 104. The opaque material 114 of the mask 110 is patterned with the desired pattern to be transferred to the material layer 104 of the workpiece 101. For example, the opaque material 114 may be patterned with a pattern for alternating lines and spaces, where the spaces have a width $w_1$ and the lines have a width $w_2$, as shown.

Figure 2:
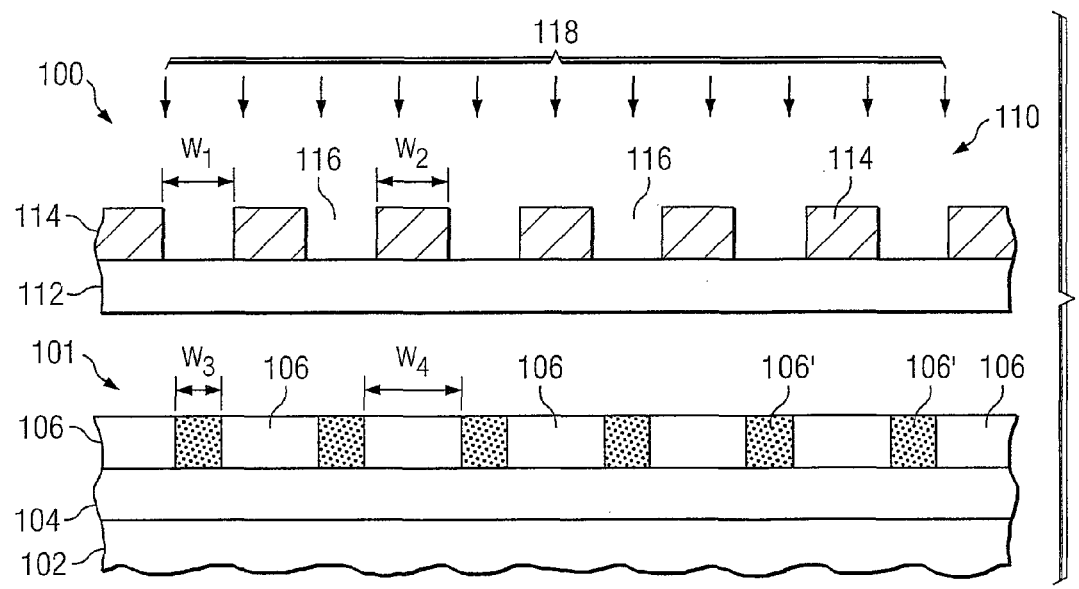
Figure 3:
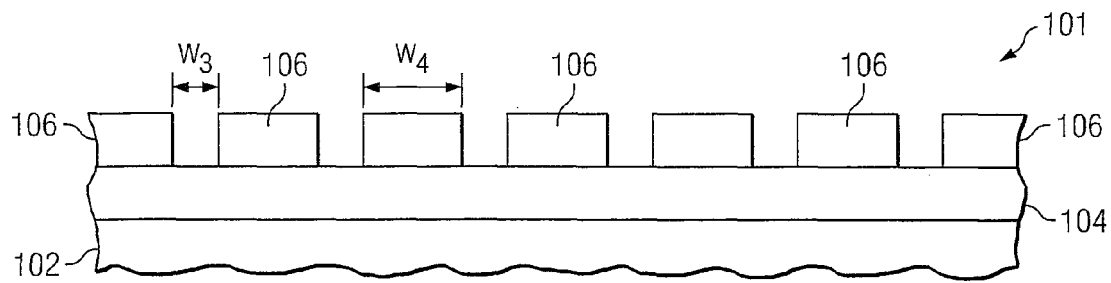
Figure 4:
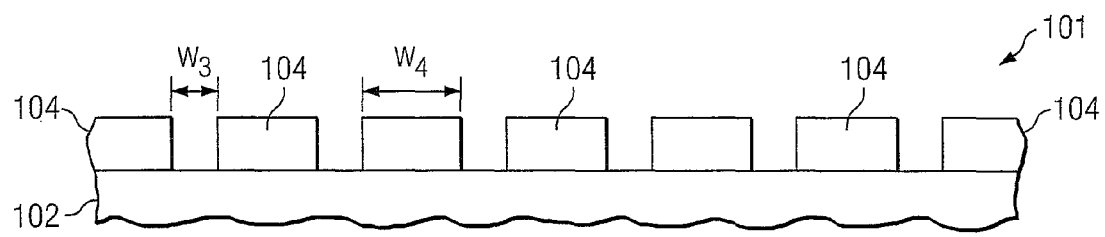

When light 118 is directed towards the semiconductor workpiece 101 through the lithography mask 110, light passes through the transparent portions 116 of the mask 110 and is blocked by the opaque portions 114 of the mask, exposing regions 106' of the layer of photosensitive material 106, as shown in FIG. 2. The layer of photosensitive material 106 is developed, and the exposed regions 106' are removed, as shown in FIG. 3. The layer of photosensitive material 106 is then used to pattern the material layer 104, e.g., by etching away exposed portions of the material layer 104. The layer of photosensitive material 106 is then removed, leaving the patterned material layer 104, as shown in FIG. 4.

In some lithography systems and methods such as the one shown in FIGS. 1 through 4, the intended pattern transfer ratio is 1:1, e.g., the features formed on the material layer 104 of the semiconductor device 101 should have the same size as the features on the lithography mask 110. However, a problem in prior art lithography systems is that the features patterned on the semiconductor device 101 do not always have a 1:1 transfer ratio. For example, in FIG. 2, when the layer of photosensitive material 106 is exposed to the light 118 through the mask 110, the exposed regions 106' of the layer of photosensitive material have a width $w_3$ that is less than the width $w_1$ of the transparent regions of the mask 101. Likewise, the unexposed regions 106 of the layer of photosensitive material have a width $w_4$ that is greater than the width $w_2$ of the opaque regions of the mask 101. Thus, when the layer of photosensitive material 106 is used to pattern the material layer 104 of the semiconductor device 101, the lines 104 formed in the material layer have a width $w_4$ that is greater than the desired width $w_2$, and the spaces between the lines 104 have a width $w_3$ that is less than the desired width $w_1$, for example.

The inability to achieve a 1:1 pattern transfer ratio may be caused by diffraction effects and other unexpected or uncontrollable effects that occur when the light 118 passes through and/or around the mask 110, for example. As feature sizes decrease, e.g., to less than about 100 nm, the inability to achieve a 1:1 pattern transfer ratio becomes more problematic. In some semiconductor devices 101, it is important that lines and spaces have the same width for the proper or optimal functioning of the device 101, e.g., such as in memory arrays or logic circuitry, as examples.

In the field of lithography, a term called a "process factor" (k1) is used to quantify how effective a particular lithography tool will be to print a feature on a semiconductor device. The process factor k1 for a lithography tool or system is determined using Equation 1:

$$k1 = (CD*NA)/\lambda \qquad \text{Eq. 1}$$

where CD is the critical dimension (e.g., the smallest size feature to be formed on a semiconductor device), NA is the numerical aperture of the lens system of the lithography system, and $\lambda$ is the wavelength of light. The k1 factor is defined by half-pitch resolution, and a k1 factor of 0.25 is considered a theoretical limit.

The k1 factor may be reduced by optimizing the lithography process, including the IC design, the mask, the scanner, and the photoresist. Resolution enhancement techniques (RET) are often used in lithography in an attempt to decrease the k1 factor, such as optical proximity correction (OPC) and alternating phase shift masks, as examples.

A k1 factor of between 0.25 to 0.30 is considered a resolution limit region. If the k1 factor is calculated to be below 0.30, typically, a next-generation tool, (e.g., adapted to print smaller features) will be required to pattern the semiconductor device. As an example, a 70 nm/70 nm pattern (e.g., having 70 nm wide lines and 70 nm wide spaces) is considered to be in the resolution limit of a 193 nm wavelength and 0.75 NA tool, because the k1 factor is 0.27 (k1=(70 nm*0.75)/193 nm). However, experimental results of using a 0.75 NA tool to print a 70 nm pattern, even using an alternating phase shift mask, show that the process window is very small and ineffective, and thus the 0.75 NA tool may not be used to print the pattern. Thus, a 0.85 NA lithography tool will be required in order to print a 70 nm/70 nm pattern. For example, using a 0.85 NA lithography tool raises the k1 factor up to 0.31 (k1=(70 nm*0.85)/193 nm). However, in a manufacturing facility for semiconductor devices, there may be limited time available on the higher-NA tools, for example.

Embodiments of the present invention provide methods for printing line and space features, wherein the lines and spaces have substantially equal widths. Lower-NA tools may be used to pattern the features. For example, the size of the lines and spaces are within the resolution limit region of the photolithographic exposure tool. As an example, in the example in the previous paragraph, a 0.75 NA lithography tool may be used to pattern 70 nm lines and spaces features, at a wavelength of 193 nm, in accordance with an embodiment of the present invention.

The width of the lines of the mask pattern is decreased, and the width of the spaces of the mask pattern is increased, in accordance with embodiments of the present invention. The width of the lines of the mask pattern is preferably decreased by the same amount the width of the spaces of the mask pattern is decreased, for example. When the pattern of the mask is transferred to the semiconductor device, advantageously, the lines and spaces printed on the layer of photoresist, and also on the material layer to be patterned, comprise substantially the same width.

Figure 5:
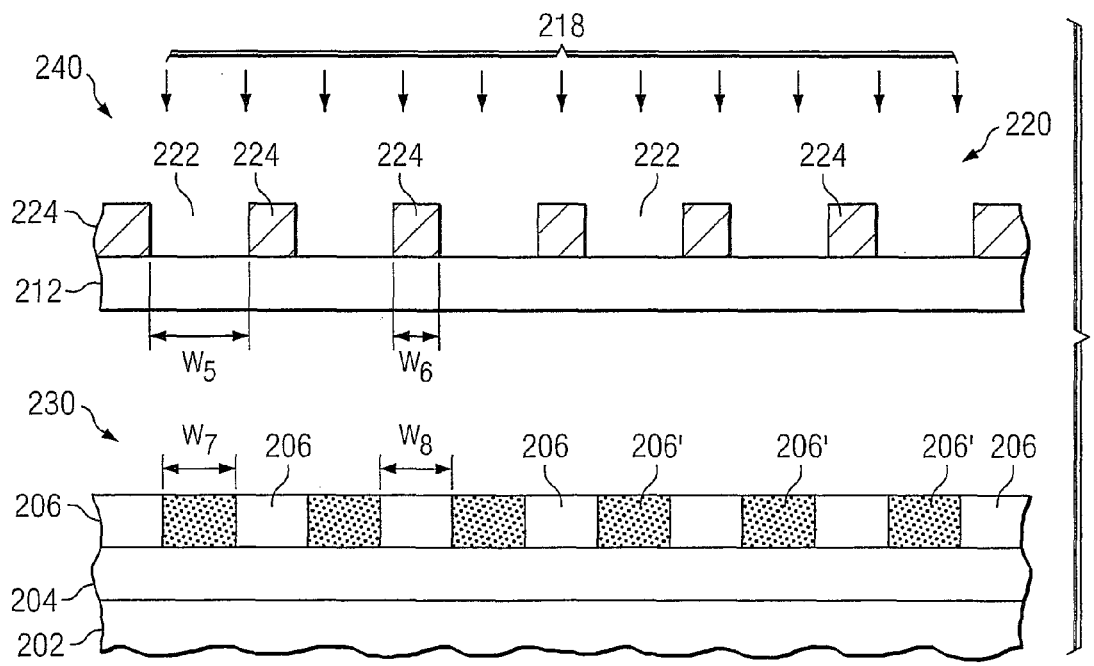
FIGS. 5 through 7 show cross-sectional views of a method of patterning a material layer of a semiconductor device in accordance with a preferred embodiment of the present invention.
Figure 6:
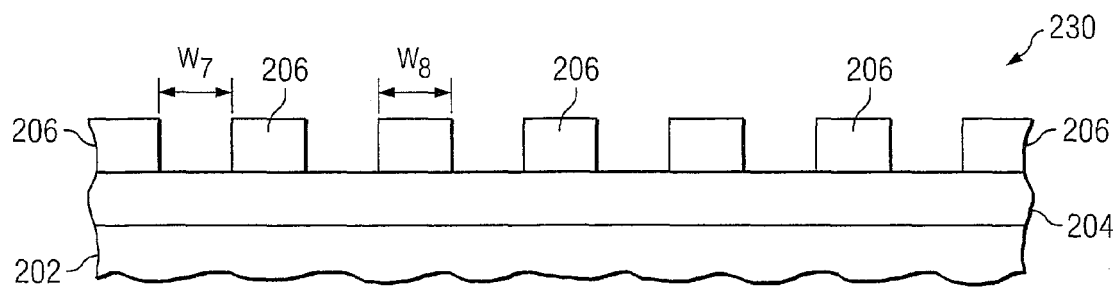
Figure 7:
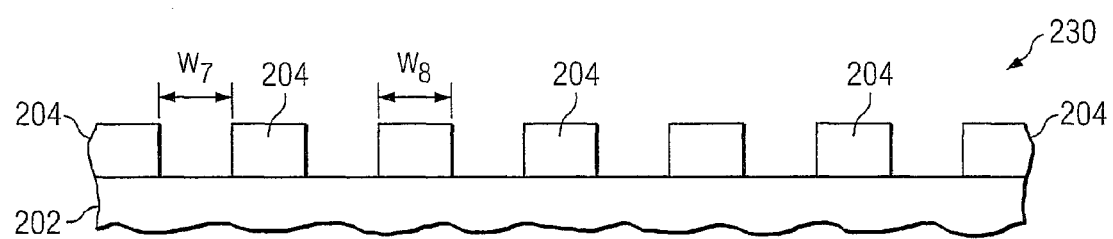

FIGS. 5 through 7 show cross-sectional views of a method of patterning a material layer 204 of a semiconductor device 230 and a lithography system 240 in accordance with a preferred embodiment of the present invention. First, a workpiece 202 is provided, as shown in FIG. 5. The workpiece 202 may include a semiconductor substrate comprising silicon or other semiconductor materials covered by an insulating layer, for example. The workpiece 202 may also include other active components or circuits, not shown. The workpiece 202 may comprise silicon oxide over single-crystal silicon, for example. The workpiece 202 may include other conductive layers or other semiconductor elements, e.g., transistors, diodes, etc. Compound semiconductors, GaAs, InP, Si/Ge, or SiC, as examples, may be used in place of silicon. The workpiece 202 may comprise a silicon-on-insulator (SOI) substrate, for example.

A material layer 204 is deposited or formed over the workpiece 202. The material layer 204 may comprise an insulating material, a semiconductive material, or a conductive material, as examples. In some embodiments, the material layer 204 may comprise a conductive material and/or semiconductive material that will be subtractively etched to form conductive lines. In other embodiments, the material layer 204 may comprise an insulating material that will be patterned with the shape of conductive lines and later filled with a conductive and/or semiconductive material to form conductive lines within the patterned insulating material, in a damascene (e.g., a single or dual damascene) process. The conductive lines that will be formed may comprise wordlines or bitlines of a memory device, or conductive lines to connect logic and/or other circuitry, as examples. The material layer 204 may comprise a thickness of about 500 nm or less, although alternatively, the material layer 204 may be greater than 500 nm thick, for example.

A layer of photosensitive material 206 is deposited over the material layer 204, as shown in FIG. 5. The layer of photosensitive material 206 may comprise a photoresist having a thickness of about 250 nm or less, for example, although alternatively, the layer of photosensitive material 206 may comprise other dimensions.

A desired layout for the material layer 204 is determined. The layout comprises a plurality of lines and spaces, wherein the width $w_7$ of the spaces is substantially equal to the width $w_8$ of the lines. Then, a layout for a lithography mask 220 that will be used to pattern the material layer 204 is determined, wherein the width $w_5$ of the spaces 222 is different than the width $w_6$ of the lines 224 of the lithography mask 220. The width $w_5$ of the spaces 222 and the width $w_6$ of the lines 224 of the lithography mask 220 are different than the width $w_7$ and $w_8$ of the spaces and lines 206, respectively, of the material layer 204 of the semiconductor device 230. Preferably, the width $w_5$ of the spaces 222 and the width $w_6$ of the lines 224 of the lithography mask 220 are selected so that the width $w_7$ of spaces will be substantially equal to the width $w_8$ of lines 206 on the material layer 204 when the lithography mask 220 is used to pattern the semiconductor device 230.

The width of the desired layout for the material layer 204 may comprise a critical dimension (CD) of the semiconductor device 230, e.g., a minimum feature size, for example. In a 90 nm technology node, for example, the desired width $w_7$ of the spaces on a semiconductor device for densely spaced features is preferably 45 nm, and the desired width $w_8$ of the lines of the densely spaced features is preferably also 45 nm, e.g., the lines and spaces may comprise a half pitch of the CD having a pitch of 90 nm. The lines and spaces may extend (e.g., in and out of the paper of the drawing shown in FIG. 5) by a few hundred nm or less, or several thousand nm, as examples.

Preferably, the width $w_6$ of the pattern for the lines of the lithography mask 220 is determined by decreasing the desired width $w_8$ of the lines by an adjustment amount x. The width $w_5$ of the pattern for the spaces of the lithography mask 220 is determined by increasing the desired width $w_7$ of the spaces by the adjustment amount x. Thus, to fabricate the mask 220, the width $w_8$ of the line pattern is decreased by the same amount x that the width $w_7$ that the space pattern is increased.

The adjustment amount x may not be calculatable using a predetermined equation or formula, but rather, may be determined iteratively, in accordance with some embodiments of the present invention, for example. The amount x may comprise about 50% or less than the desired width $w_7$ and $w_8$ of the lines and spaces on the material layer 204, for example, although alternatively, the amount x may comprise other dimensions. A plurality of test masks may be produced, and a plurality of test semiconductor workpieces may be patterned, and the results may be interpolated to determine the optimum adjustment amount x, for example.

The adjustment amount x may be set to a trial amount, and a first test lithography mask may be fabricated. The first test lithography mask may be used to pattern a first test semiconductor workpiece (e.g., to pattern a layer of photosensitive material formed on the workpiece, and/or use the patterned layer of photosensitive material to pattern an underlying material layer). The lines and spaces formed on the first test semiconductor workpiece (e.g., in the layer of photosensitive material and/or material layer) are measured. If the lines and spaces formed on the first test semiconductor workpiece are substantially equal in width, then the first test lithography mask dimensions are determined to be suitable or optimal for forming lines and spaces on a semiconductor device having substantially equal widths, at the particular parameters being used for the lithography system, mask, and semiconductor device. However, if the widths of the lines and spaces are not substantially equal, then the adjustment amount is altered, e.g., by increasing or decreasing x, and at least one second test lithography mask is fabricated at the altered dimensions. A second test semiconductor workpiece is patterned using the second test lithography mask, and again, the lines and spaces formed on the second test semiconductor workpiece are measured. The process may be repeated until the optimal adjustment amount x is determined to form lines and spaces having substantially equal widths on a semiconductor workpiece.

After the optimal adjustment amount x is determined, then a lithography mask 220 (e.g., suitable for repeated use during development and/or production) is manufactured, wherein the width $w_6$ of the line pattern on the mask 220 comprises the desired width $w_8$ of lines on the semiconductor device 230 decreased by the adjustment amount x, and wherein the width $w_5$ of the space pattern on the mask 220 comprises the desired width $w_7$ of spaces on the semiconductor device 230 increased by the adjustment amount x, as shown in FIG. 5.

The lithography mask 220 is then used to pattern the layer of photosensitive material 206 of the semiconductor device 230 using light 218. The light 218 may be directed at the semiconductor device 230 using a lens system, for example, not shown. The layer of photosensitive material 206 is developed, and exposed regions 206' are removed, as shown in FIG. 6. The layer of photosensitive material 206 is then used as a mask while the material layer 204 is patterned (e.g., exposed portions of the material 204 not protected by the layer of photosensitive material 206 are removed using an etch process), transferring the pattern of the layer of photosensitive material 206 to the material layer 204. The layer of photosensitive material 206 is then stripped or removed, as shown in FIG. 7, leaving the material layer 204 comprising lines having a width $w_8$ and spaces having a width $w_7$, wherein the widths $w_7$ and $w_8$ of the spaces and lines, respectively, are substantially equal.

The material layer 204 may include a hard mask disposed over a layer of material to be patterned, not shown. In some embodiments, for example, the layer of photosensitive material 206 is patterned using the lithography mask, and then the layer of photosensitive material 206 is used to pattern the hard mask. The layer of photosensitive material 206 is then removed, and the hard mask is used to pattern the material layer, for example.

Figure 8:
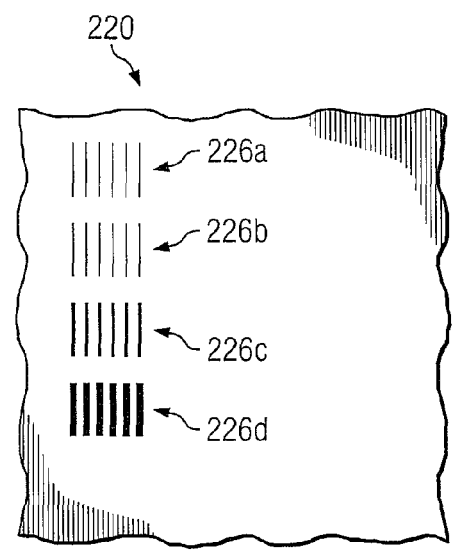
FIG. 8 shows a top view of a test mask that may be used to determine the optimal width for the lines and spaces of a lithography mask in accordance with an embodiment of the present invention.

In some embodiments, rather than using a plurality of test lithography masks to determine the optimum width of the lines and spaces on the test mask (e.g., determining the adjustment amount x of the lines and spaces), a single test lithography mask may be used. FIG. 8 shows a top view of a test mask 220 that may be used to determine the optimal width for the lines and spaces of a lithography mask in accordance with an embodiment of the present invention. A plurality of test patterns 226a, 226b, 226c, and 226d may be formed on the test mask 220, as shown. Preferably, the test patterns 226a, 226b, 226c, and 226d comprise lines and spaces having the same pitch, but a different adjustment amount x, for example. A test semiconductor device is patterned using the test mask 220, and the pattern 226a, 226b, 226c, and 226d that results in lines and spaces having substantially equal widths on the test semiconductor device is the pattern that is used when a lithography mask that will be used for development or production is fabricated.

Figure 9:
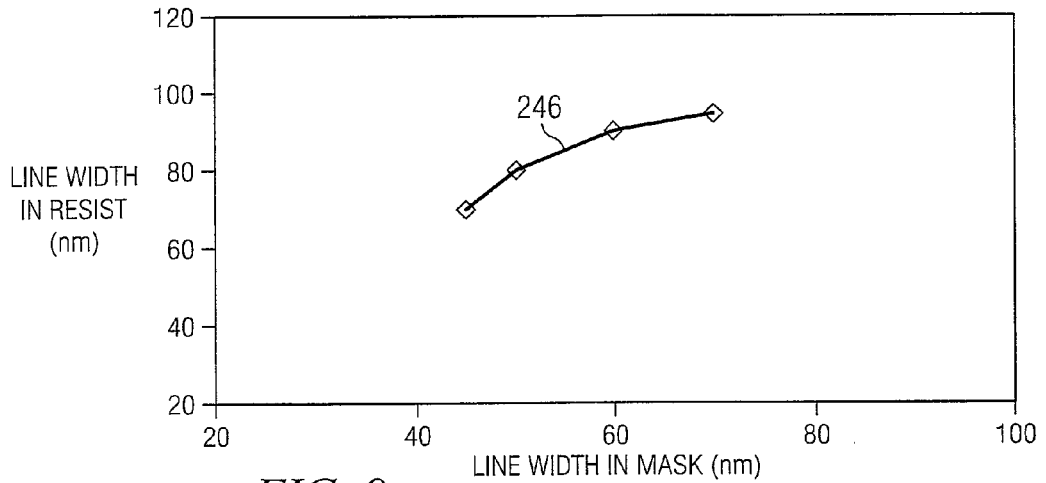
FIG. 9 is a graph illustrating that as the line width is increased on the mask, the line width on a layer of photoresist is disproportionately increased.

FIG. 9 is a graph 246 illustrating that as the line width is increased on a lithography mask, the line width on a layer of photoresist is disproportionately increased. The graph shows the line width in a mask in nm on the x axis and line width in a layer of photoresist patterned using the mask on the y axis, for a fixed pitch of 140 nm. The relationship of the line width on the layer of photoresist to the line width on the mask is not linear, due to diffraction effects and because the feature sizes are so small, being close to the lower limit of the lithography tool's resolution capability, as examples. Embodiments of the present invention described herein accommodate for the non-linearity of the graph, enabling the patterning of very fine pitch features close to the lower limits of a lithography tool's resolution capability, for example.

Embodiments of the present invention may be used in lithography masks comprising opaque and transparent regions, in alternating phase-shift masks, and immersion lithography systems, for example. FIG. 5 shows an embodiment of the invention implemented in a binary lithography mask 220, for example. The mask 220 may comprise a substantially transparent material 212 comprising quartz glass having a thickness of about ¼", with a non-transparent material 224 such as chromium, which is opaque, having a thickness of about 30 nm bonded to the quartz glass. Alternatively, the non-transparent material 224 may comprise about 70 nm of a translucent material such as molybdenum silicon (MoSi), or a bilayer of tantalum and silicon dioxide (Ta/SiO$_2$). If the non-transparent material 224 comprises MoSi, the thickness may be 70 nm, and if the non-transparent material 224 comprises Ta/SiO$_2$, the Ta layer may comprise about 20 nm and the SiO$_2$ layer may comprise about 140 nm. Alternatively, other materials and dimensions may also be used for the transparent material 212 and the non-transparent material 224 of the mask 220, for example.

Figure 10:
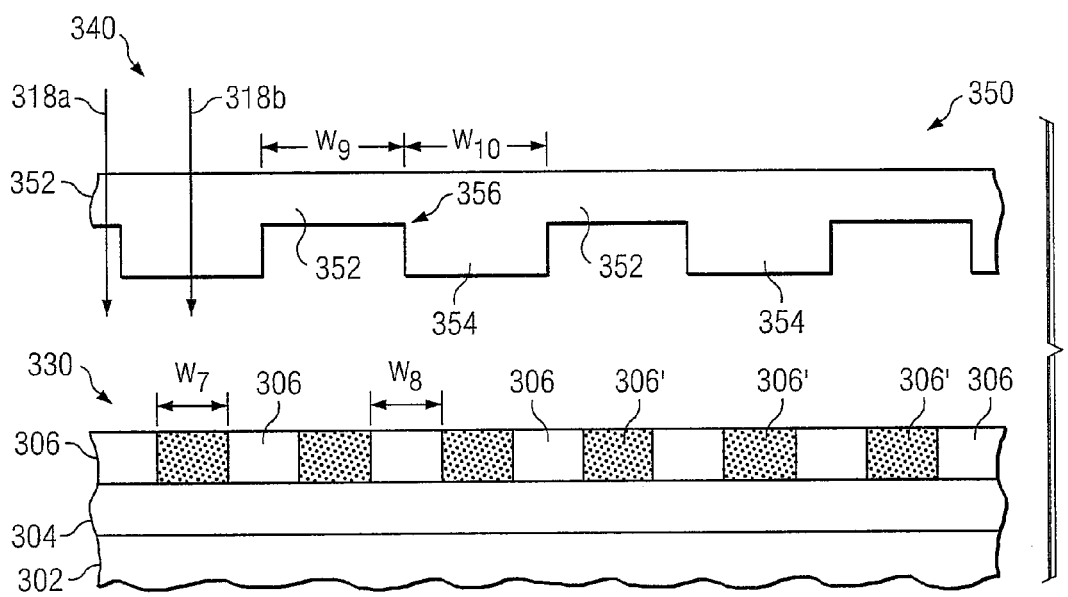
FIG. 10 shows a cross-sectional view of an embodiment of the present invention implemented in a phase-shifting mask.
Figure 12:
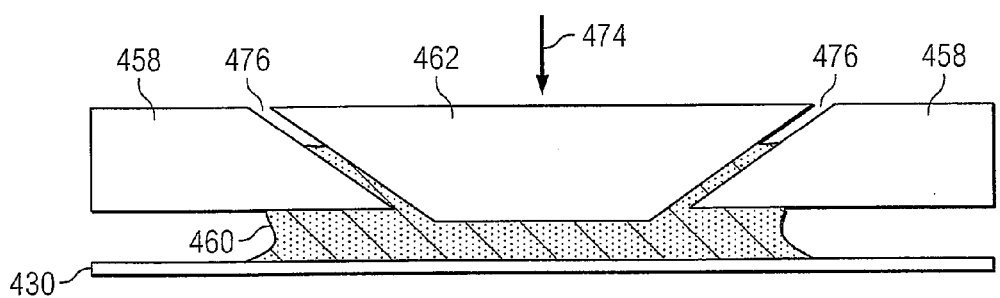
FIG. 12 shows a more detailed cross-sectional view of the immersion head and workpiece of the embodiment shown in FIG. 11.
Figure 11:
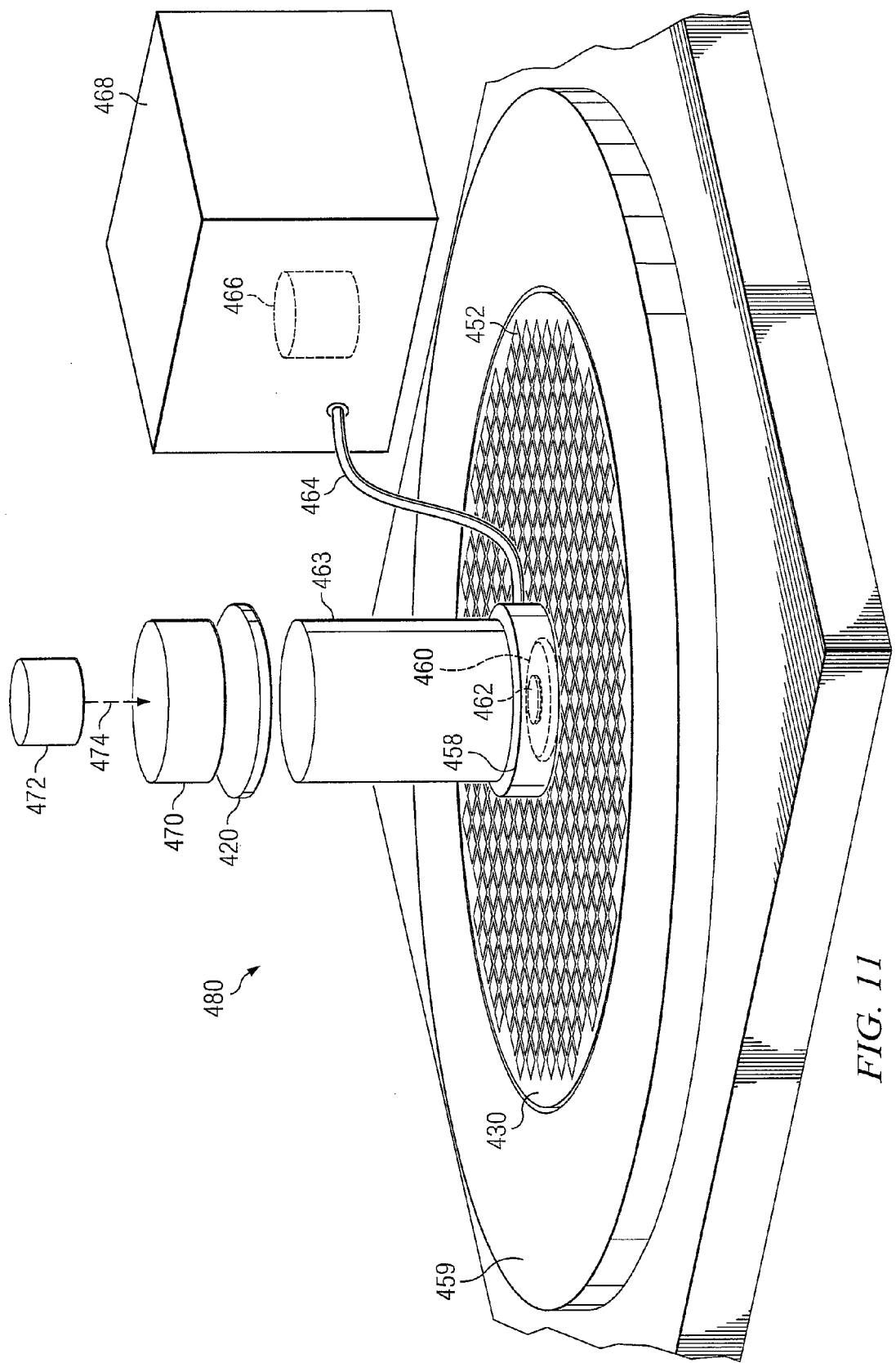
FIG. 11 shows an embodiment of the present invention implemented in an immersion lithography system.

FIG. 10 shows a cross-sectional view of an embodiment of the present invention implemented in a phase-shifting mask. FIG. 11 shows an embodiment of the present invention implemented in an immersion lithography system, and FIG. 12 shows a more detailed cross-sectional view of the immersion head and workpiece of the embodiment shown in FIG. 11. Like numerals are used for the various elements in FIGS. 10 through 12 that were described in the previous figures, and to avoid repetition, each reference number shown in FIGS. 10 through 12 is not described again in detail herein. Rather, similar materials x02, x04, x06, etc. . . . are preferably used for the various material layers shown as were described for FIGS. 5 through 7, where x=2 in FIGS. 5 through 7, x=3 in FIG. 10, and x=4 in FIGS. 11 and 12.

In FIG. 10, a lithography system 340 is shown, wherein an alternating phase shift mask 350 comprises a substantially transparent material such as quartz glass having thinner regions 352 and thicker regions 354. The phase of the light passing through the mask 350 is shifted by 180 degrees between the regions 352 and 354 having different thicknesses. Light 318a passing through the thinner regions 352 may have a 0 degree phase shift, and light 318b passing through the thicker regions 354 may have a 180 degree phase shift, for example. The mask 350 may optionally comprise opaque regions (not shown) comprised of chromium, and/or may comprise only substantially transparent regions, as shown.

In transition regions 356 between the thinner regions 352 and thicker regions 354, destructive interference of the light occurs, blocking the light 318a/318b so that the layer of photosensitive material 306 on the semiconductor device is not exposed, forming the line pattern on the semiconductor device. However, in regions 352 and 354 spaced apart from the transition regions 356, light 318a and 318b, respectively, is allowed to pass through the mask 350, exposing the layer of photosensitive material in regions 306' and forming the space pattern on the layer of photosensitive material on the semiconductor device. In accordance with embodiments of the present invention, the width $w_9$ of the thinner regions 352 and the width $w_{10}$ of the thicker regions 354 are adjusted by the adjustment amount x described previously herein to adjust the width $w_7$ on the semiconductor device. Note that in this embodiment, the width $w_8$ may not be adjustable, because the transition region 356 effect is based on a phase shift, for example. Rather, the width $w_9$ of the thinner regions 352 and the width $w_{10}$ of the thicker regions 354 may be adjusted to match the width $w_7$ to the width $w_8$, for example.

Embodiments of the present invention are particularly useful when implemented in immersion lithography systems, as shown in FIGS. 11 and 12. FIG. 11 shows an embodiment of the present invention implemented in an immersion lithography system 480 or immersion exposure tool 480 that includes a wafer support 459 adapted to support a wafer or workpiece 430. The wafer support 459 is also referred to as a wafer stage or exposure chuck, for example. A projection lens system 463 is disposed proximate the wafer 430. A fluid 460 that typically comprises de-ionized water is introduced between a last element or lens 462 of the projection lens system 463 and the wafer 430 during the exposure process, e.g., by an immersion head 458 clamped to the end of the lens system 463.

Light 474 is emitted from a light source 472 through a lens system 470 through the novel lithography mask 420 previously described herein, through the projection lens system 463 to expose one or more die 452 of the workpiece 430. The wafer support 459 and the wafer 430 are moved during the patterning of the individual die or regions of die 452 on the wafer 430, e.g., from one side to another, and thus the immersion exposure tool 480 may also be referred to as an immersion lithography scanner. The projection lens system 463 and lens system 470 are typically quite large and therefore usually remain stationary, for example.

The fluid 460 is provided by a nozzle or by input and output ports (see FIG. 12) within the immersion head 458, for example. The immersion exposure tool 480 also includes a fluid handler 468 adapted to provide the fluid 460. The fluid handler 468 may comprise a cabinet having components such as a fluid supply 466 and temperature controller, as examples, although the fluid handler 468 may also include other components, not shown. The fluid handler 468 may be coupled to the immersion head 458 by a hose 464 or other fluid-delivering means.

FIG. 12 shows a more detailed cross-sectional view of the immersion head 458 and workpiece 430 of the embodiment shown in FIG. 11. The fluid 460 makes contact with a portion of the top surface of the wafer 430 and the bottom surface of the last element 462 of the projection lens system 463. The immersion head 458 includes ports 476 that may comprise an annular ring of ports for supplying the fluid 460 between the wafer 430 and the immersion head 458. The ports 476 may comprise input and output ports for injecting and removing the fluid 460, for example.

Embodiments of the present invention provide methods of adjusting features in a lithography mask in order to obtain the optimum process window for fabricating dense line and space patterns on a semiconductor device. Because the printing fidelity is different in the resolution limit regime of a photolithography tool, preferably only the dense line and space feature patterns are adjusted, and larger patterns e.g., two or more times greater than the CD of the device (not shown in the figures), are preferably not adjusted, in accordance with embodiments of the invention.

Experimental results show that alternating lines and spaces of equal widths and comprising a CD of a device may be formed using the masks described herein. In a resolution limit region for a lithography tool, where k1 is between 0.25 and 0.30, the process window is increased, in accordance with embodiments of the present invention. In one experiment, for example, a 1150i and 0.75 NA scanner and a lithography mask having a pattern of alternating 50 nm lines and 100 nm spaces resulted in the formation of 75 nm lines and 75 nm spaces in a layer of photoresist. Cross-section images showed good pattern profiles, and the depth of focus (DOF) was 0.75 μm. In contrast, using the same scanner and a prior art lithography mask having a pattern of alternating 75 nm lines and 75 nm spaces, a poor pattern profile results, and the DOF is only about 0.4 μm.

Table 1 shows experimental results of embodiments of the present invention that were implemented using a 193 nm and 0.75 NA immersion tool (1150i), and values of the adjustment amount x that were determined to be optimal at particular dimensions.

TABLE 1

|  | Case 1 | Case 2 |
| --- | --- | --- |
| Line/space dimension in mask | 45 nm/95 nm | 50 nm/100 nm |
| Line/space dimension in resist | 70 nm/70 nm | 75 nm/75 nm |
| Adjustment amount x | 25 nm | 25 nm |

Table 2 shows experimental results of embodiments of the present invention that were implemented using a 193 nm and 0.85 NA immersion tool (1250i), and values of the adjustment amount x that were determined to be optimal at particular dimensions.

TABLE 2

|  | Case 3 | Case 4 |
| --- | --- | --- |
| Line/space dimension in mask | 40 nm/80 nm | 45 nm/85 nm |
| Line/space dimension in resist | 60 nm/60 nm | 65 nm/65 nm |
| Adjustment amount x | 20 nm | 20 nm |

Advantages of embodiments of the invention include providing increased process windows and improved resolution for lithography systems. The practically usable region of photolithography tools and systems may be extended by embodiments of the present invention. For example, in the prior art, the practically usable regions of lithography tools were at a k1 factor of greater than 0.30. By implementing the novel masks and lithography methods of embodiments of the present invention described herein, the practically usable region of a lithography tool may be increased further to a k1 factor of greater than about 0.27, for example.

The implementation of embodiments of the present invention in immersion lithography systems and methods is particularly advantageous, because the k1 factor extension is combined with a DOF gain from the immersion lithography system, resulting in further improved lithography results, for example.

The lithography masks, systems, and lithography methods described herein may be used to fabricate many types of semiconductor devices, including memory devices and logic devices, as examples, although other types of semiconductor devices, integrated circuits, and circuitry may be fabricated using the novel embodiments of the present invention described herein. Embodiments of the present invention may be implemented in lithography systems using light at a wavelength of 193 nm, for example, although alternatively, other wavelengths of light may also be used.

Although embodiments of the present invention and their advantages have been described in detail, it should be understood that various changes, substitutions and alterations can be made herein without departing from the spirit and scope of the invention as defined by the appended claims. For example, it will be readily understood by those skilled in the art that many of the features, functions, processes, and materials described herein may be varied while remaining within the scope of the present invention. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method of manufacturing a semiconductor device, the method comprising:
    illuminating a lithography mask, the lithography mask comprising a first pattern for a plurality of alternating lines and spaces, the lines of the first pattern comprising a first width, the spaces of the first pattern comprising a second width, the second width being different than the first width; and
    forming a second pattern in a layer of photosensitive material using the lithography mask with the first pattern, wherein the second pattern comprises a plurality of alternating lines and spaces, wherein lines of the alternating lines and spaces of the second pattern comprise a third width, wherein spaces of the alternating lines and spaces of the second pattern comprise the same third width, and wherein the third width is different than the first width and the second width.

2. The method according to claim 1, further comprising using the layer of photosensitive material to pattern an underlying material layer, forming lines and spaces comprising the third width in the underlying material layer.

3. The method according to claim 2, wherein the underlying material layer comprises a conductive material, a semiconductive material, or an insulating material.

4. The method according to claim 1, wherein the first width is the third width decreased by an adjustment amount, and wherein the second width is the third width increased by the adjustment amount.

5. The method according to claim 4, wherein the adjustment amount is equal to about 50% or less of the third width.

6. The method according to claim 1, wherein the lithography mask comprises a binary mask.

7. The method according to claim 1, wherein the lithography mask comprises an alternating phase shift mask.

8. The method according to claim 7, wherein a non-transparent material of the alternating phase shift mask comprises molybdenum silicon.

9. The method according to claim 7, wherein a non-transparent material of the alternating phase shift mask comprises a bilayer of tantalum and silicon dioxide (Ta/SiO$_2$).

10. A method of manufacturing a semiconductor device, the method comprising:
    forming a second pattern of alternating lines and spaces in a layer of photosensitive material by exposing to light a first pattern of alternating lines and spaces of a lithography mask,
    wherein the alternating lines of the first pattern comprise a first width, wherein the alternating spaces of the first pattern comprise a second width, and wherein the second width is different than the first width, and
    wherein each line and each space of the alternating lines and spaces of the second pattern comprise a third width, the third width being different than the first width and the second width.

11. The method according to claim 10, wherein the layer of photosensitive material is disposed on a material layer.

12. The method according to claim 11, further comprising using the layer of photosensitive material as a mask and etching the material layer, wherein the material layer is a conductive material or a semiconductive material.

13. The method according to claim 12, further comprising removing the layer of photosensitive material.

14. A method of manufacturing a semiconductor device, the method comprising:
    exposing to light a photoresist material layer through a lithography mask, the lithography mask having lines and spaces with different widths from each other thereby forming lines and spaces in the photoresist material layer each having a same width.

15. The method according to claim 14, wherein the photoresist material layer is disposed on a material layer and wherein the material layer is a conductive layer or a semiconductive layer.

16. The method according to claim 15, further comprising etching the material layer while using the photoresist material layer as a mask.

17. The method according to claim 16, further comprising removing the photoresist material layer.

18. The method according to claim 14, wherein the photoresist material layer is disposed on a material layer and wherein the material layer is an insulating material.

19. The method according to claim 14, wherein the lithography mask is an alternating phase shift mask, and wherein a non-transparent material of the alternating phase shift mask is molybdenum silicon.

20. The method according to claim 14, wherein the lithography mask is an alternating phase shift mask and a non-transparent material of the alternating phase shift mask is a bilayer of tantalum and silicon dioxide (Ta/SiO$_2$).

* * * * *